(12) United States Patent
Kwak et al.

(10) Patent No.: US 11,649,542 B2
(45) Date of Patent: *May 16, 2023

(54) MULTI-LAYERED ZINC ALLOY PLATED STEEL HAVING EXCELLENT SPOT WELDABILITY AND CORROSION RESISTANCE

(71) Applicant: POSCO, Pohang-si (KR)

(72) Inventors: Young-Jin Kwak, Gwangyang-si (KR); Goo-Hwa Kim, Pohang-si (KR); Mun-Jong Eom, Gwangyang-si (KR); Seok-Jun Hong, Gwangyang-si (KR); Kyoung-Pil Ko, Gwangyang-si (KR); Yong-Hwa Jung, Gwangyang-si (KR); Dong-Yoeul Lee, Gwangyang-si (KR); Tae-Yeob Kim, Gwangyang-si (KR); Kyung-Hoon Nam, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/529,788

(22) Filed: Nov. 18, 2021

(65) Prior Publication Data

US 2022/0074040 A1 Mar. 10, 2022

Related U.S. Application Data

(62) Division of application No. 16/471,943, filed as application No. PCT/KR2017/015314 on Dec. 22, 2017, now Pat. No. 11,208,716.

(30) Foreign Application Priority Data

Dec. 26, 2016 (KR) .......................... 10-2016-0178834

(51) Int. Cl.
*C23C 30/00* (2006.01)
*C23C 28/02* (2006.01)
(Continued)

(52) U.S. Cl.
CPC .............. *C23C 14/16* (2013.01); *B32B 15/01* (2013.01); *B32B 15/013* (2013.01); *B32B 15/04* (2013.01);
(Continued)

(58) Field of Classification Search
CPC ......... C23C 30/00; C23C 30/005; C23C 2/00; C23C 2/04; C23C 2/06; C23C 2/26;
(Continued)

(56) References Cited

U.S. PATENT DOCUMENTS 5,002,837 A 3/1991 Shimogori et al.
5,135,817 A 8/1992 Shimogori et al.
(Continued)

FOREIGN PATENT DOCUMENTS

CN 1135537 11/1996
CN 104903493 9/2015
(Continued)

OTHER PUBLICATIONS

Chinese Office Action—Chinese Application No. 201780080831.6 dated Oct. 10, 2020, citing CN 1135537, CN 104903493, and KR 2016-0054111.
(Continued)

*Primary Examiner* — Michael E. La Villa
(74) *Attorney, Agent, or Firm* — Cantor Colburn LLP

(57) ABSTRACT

Provided is a multilayer zinc alloy plated steel material comprising a base steel material and multiple plating layers formed on the base steel material, wherein each of the multiple plating layers includes one of a Zn plating layer, a Mg plating layer, and a Zn—Mg alloy plating layer, and the
(Continued)

100 ratio of the weight of Mg contained in the multiple plating layers to the total weight of the multiple plating layers is from 0.13 to 0.24.

10 Claims, 4 Drawing Sheets

(51) Int. Cl.
| | |
|---|---|
| C23C 28/00 | (2006.01) |
| C23C 14/16 | (2006.01) |
| C23C 14/24 | (2006.01) |
| C23C 14/14 | (2006.01) |
| C23C 2/28 | (2006.01) |
| C23C 2/26 | (2006.01) |
| C23C 2/00 | (2006.01) |
| C23C 2/40 | (2006.01) |
| C23C 2/04 | (2006.01) |
| C23C 2/06 | (2006.01) |
| C22C 18/00 | (2006.01) |
| C22C 23/00 | (2006.01) |
| C22C 23/04 | (2006.01) |
| C22C 38/02 | (2006.01) |
| C22C 38/04 | (2006.01) |
| C22C 38/06 | (2006.01) |
| C22C 38/60 | (2006.01) |
| B32B 15/01 | (2006.01) |
| B32B 15/04 | (2006.01) |
| B32B 15/18 | (2006.01) |

(52) U.S. Cl.
CPC ............ *B32B 15/043* (2013.01); *B32B 15/18* (2013.01); *C22C 18/00* (2013.01); *C22C 23/00* (2013.01); *C22C 23/04* (2013.01); *C22C 38/02* (2013.01); *C22C 38/04* (2013.01); *C22C 38/06* (2013.01); *C22C 38/60* (2013.01); *C23C 2/00* (2013.01); *C23C 2/04* (2013.01); *C23C 2/06* (2013.01); *C23C 2/26* (2013.01); *C23C 2/28* (2013.01); *C23C 2/40* (2013.01); *C23C 14/14* (2013.01); *C23C 14/165* (2013.01); *C23C 14/24* (2013.01); *C23C 28/02* (2013.01); *C23C 28/021* (2013.01); *C23C 28/023* (2013.01); *C23C 28/025* (2013.01); *C23C 28/32* (2013.01); *C23C 28/321* (2013.01); *C23C 28/322* (2013.01); *C23C 28/3225* (2013.01); *C23C 30/00* (2013.01); *C23C 30/005* (2013.01); *C21D 2211/001* (2013.01); *Y10T 428/12785* (2015.01); *Y10T 428/12799* (2015.01); *Y10T 428/12951* (2015.01); *Y10T 428/12972* (2015.01); *Y10T 428/12979* (2015.01)

(58) Field of Classification Search
CPC .. C23C 2/28; C23C 2/40; C23C 14/16; C23C 14/14; C23C 14/165; C23C 14/24; C23C 28/02; C23C 28/021; C23C 28/023; C23C 28/025; C23C 28/32; C23C 28/321; C23C 28/322; C23C 28/3225; B32B 15/01; B32B 15/013; B32B 15/04; B32B 15/043; B32B 15/18; C22C 18/00; C22C 23/00; C22C 23/04; C22C 38/02; C22C 38/04; C22C 38/06; C22C 38/60; C21D 2211/001; Y10T 428/12785; Y10T 428/12799; Y10T 428/12951; Y10T 428/12972; Y10T 428/12979; Y10T 428/26

See application file for complete search history.

(56) References Cited

U.S. PATENT DOCUMENTS

| | | | |
|---|---|---|---|
| 5,648,177 | A | 7/1997 | Fukui et al. |
| 5,747,111 | A | 5/1998 | Fukui et al. |
| 11,414,743 | B2 * | 8/2022 | Kwak .................. C22C 38/002 |
| 2010/0104752 | A1 | 4/2010 | Choquet et al. |
| 2010/0186854 | A1 | 7/2010 | Bertrand et al. |
| 2010/0285333 | A1 | 11/2010 | Kwak et al. |
| 2015/0013409 | A1 | 1/2015 | Monnoyer et al. |
| 2015/0030875 | A1 | 1/2015 | Lee et al. |
| 2015/0352812 | A1 | 12/2015 | Jung et al. |

FOREIGN PATENT DOCUMENTS

| | | |
|---|---|---|
| EP | 0730045 | 9/1996 |
| EP | 2652166 | 10/2013 |
| EP | 2794951 | 10/2014 |
| EP | 3239346 | 11/2017 |
| JP | S64017853 | 1/1989 |
| JP | H01116062 | 5/1989 |
| JP | H02141588 | 5/1990 |
| JP | H07207430 | 8/1995 |
| JP | H08003728 | 1/1996 |
| JP | H08081761 | 3/1996 |
| JP | H09137267 | 5/1997 |
| JP | 2624272 | 6/1997 |
| JP | H09228030 | 9/1997 |
| JP | H10068063 | 3/1998 |
| JP | 2011508088 | 3/2011 |
| KR | 19960031640 | 9/1996 |
| KR | 20090006881 | 1/2009 |
| KR | 20090122247 | 11/2009 |
| KR | 20100030627 | 3/2010 |
| KR | 20130075501 | 7/2013 |
| KR | 20140083836 | 7/2014 |
| KR | 20160054111 | 5/2016 |
| KR | 20160078912 | 7/2016 |
| WO | 2007074994 | 7/2007 |

OTHER PUBLICATIONS

European Search Report—European Application No. 17888071.2 dated Feb. 24, 2020, citing EP 2 794 951, EP 2 652 166, EP 0 730 045, U.S. Pat. No. 5,002,837, Jung, et al., KR 2016 0078912, JP H08 81761, and WO 2007/074994.

European Search Report—European Application No. 17888071.2, dated Nov. 12, 2019, citing EP 2 794 951, EP 2 652 166, EP 0 730 045 and U.S. Pat. No. 5,002,837.

International Search Report—PCT/KR2017/015314 dated Apr. 17, 2018.

Japanese Office Action—Japanese Application No. 2019-534653 dated Sep. 15, 2020, citing JP H01-116062, JP 2011-508088, and JP H07-207430.

Jung, et al., Mg Content Dependence of EML-PVD Zn—Mg Coating Adhesion on Steel Strip, Metallurgical and Materials Transactions A, Sep. 2016, vol. 47A, pp. 4594-4605.

\* cited by examiner

MULTI-LAYERED ZINC ALLOY PLATED STEEL HAVING EXCELLENT SPOT WELDABILITY AND CORROSION RESISTANCE

TECHNICAL FIELD

The present disclosure relates to a multilayer zinc alloy plated steel material having excellent spot weldability and corrosion resistance, and more particularly, to a multilayer zinc alloy plated steel material having excellent spot weldability and corrosion resistance and (being) applicable to automobiles, home appliances, and construction, etc.

BACKGROUND ART

Zinc plating methods for suppressing the corrosion of iron by cathodic protection provide high corrosion resistance and economical efficiency and are thus widely used for manufacturing steel materials having high corrosion resistance, and there has been increasing demand for zinc plated steel materials in industrial fields such as automobiles, home appliances, constructions.

When a zinc plated steel material is exposed to a corrosive environment, zinc having a lower oxidation-reduction potential than iron undergoes corrosion first, and thus corrosion of the steel material is suppressed by sacrificial corrosion protection. Along with this, dense corrosion products are formed on the surface of the steel material while zinc of the plating layer is oxidized, thereby protecting the steel material from the corrosive environment and improving the corrosion resistance of the steel material.

However, air pollution and corrosive environments have increased with industrial advances, and regulations on resources and energy savings have been tightened. Therefore, the need to develop steel materials having higher corrosion resistance than existing zinc plated steel materials has increased. To this end, various studies have been conducted on the technology for manufacturing zinc alloy plated steel materials which have improved corrosion resistance by the addition of elements such as magnesium (Mg) to plating layers.

In general, zinc plated steel materials or zinc alloy plated steel materials (hereinafter, referred to as "zinc plated steel materials") are used as products after being processed into parts through forming process etc. and being welded through welding processes such as a spot welding process. In the case of zinc plated steel materials having base steel materials such as high-strength steel materials having austenite or retained austenite as a microstructure or high-strength interstitial free (IF) steel materials having a high phosphorus (P) content, molten zinc permeate into the base steel materials along grain boundaries during a spot welding process, causing brittle cracks, that is, liquid metal embrittlement (LME).

FIG. 1 is an enlarged image showing a weld zone of welded members in which LME cracking occurred as a result of spot welding. In FIG. 1, cracks formed in the upper and lower portions of a nugget are referred to as type A cracks, a crack formed in a weld shoulder portion is referred to a type B cracks, and a cracks formed inside a steel sheet because of misalignment of electrodes during welding is referred to as a type C cracks. Among such cracks, type B and C cracks greatly affect the soundness of materials, and it is a key requirement in the art to prevent the formation of cracks during welding.

DISCLOSURE

Technical Problem

An aspect of the present disclosure may provide a multilayer zinc alloy plated steel material having high spot weldability and corrosion resistance.

Technical Solution

According to an aspect of the present disclosure, a multilayer zinc alloy plated steel material may include a base steel material and multiple plating layers formed on the base steel material, wherein each of the multiple plating layers may include one of a Zn plating layer, a Mg plating layer, and a Zn—Mg alloy plating layer, and the ratio of the weight of Mg contained in the multiple plating layers to the total weight of the multiple plating layers may be from 0.13 to 0.24.

Advantageous Effects

One of the effects of the present disclosure is that the multilayer zinc alloy plated steel material has high spot weldability, and thus even when a steel material such as a high-strength steel material including austenite or retained austenite as a microstructure, or a high-strength interstitial free (IF) steel material having a high phosphorus (P) content is used as a base steel material, the occurrence of liquid metal embrittlement (LME) may be effectively suppressed.

In addition, the multilayer zinc alloy plated steel material of the present disclosure may have high corrosion resistance even though the plating amount thereof is low, and thus the multilayer zinc alloy plated steel material may be environmentally friendly and economical.

In addition, according to embodiments of the present disclosure, the multilayer zinc alloy plated steel material may have high platability.

In addition, according to embodiments of the present disclosure, the multilayer zinc alloy plated steel material may have improved phosphate treatment properties.

Aspects and effects of the present disclosure are not limited thereto, and may be apparently understood through the descriptions of embodiments of the present disclosure.

BEST MODE

Figure 1:
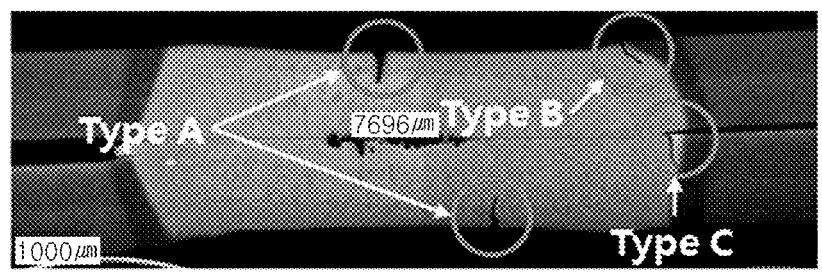
FIG. 1 is an enlarged image showing a weld zone of welded members in which LME cracking occurred as a result of spot welding.

It is known that as the content of Mg increases in Zn—Mg alloy plated steels, the Zn—Mg alloy plated steels increase in corrosion resistance but decrease in spot weldability, and thus the maximum content of Mg in plating layers is generally adjusted to be about 10 wt %. The reason for this is that Zn—Mg intermetallic compounds having a low melting point easily dissolve in a Zn—Mg plating layer to cause liquid metal embrittlement. However, additional studies of the present inventors have showed that even if the content of Mg in a plating layer exceeds 10 wt %, spot weldability is markedly improved in a certain Mg content range. In particular, this spot weldability improving effect is obtainable in the case of forming two or more plating layers as well as in the case of forming a single plating layer, and based on this, the present inventors have found that additional effects such as improvements in platability and phosphate treatment properties are also obtainable and have invented the present invention.

Hereinafter, a zinc alloy plated steel material having high spot weldability and corrosion resistance will be described in detail. In the present disclosure, the upper and lower sides of a steel sheet may be reversed at any time depending on the state of stacking, and thus the expression "on" such as "on a base steel material" merely refers to the state of contact but does not refers to or imply the state of being located on an upper side."

The zinc alloy plated steel material of the present disclosure includes a base steel material and multiple plating layers formed on the base steel material. In the present disclosure, the base steel material is not limited to particular types. For example, the base steel material may be a steel sheet or a steel wire rod.

Furthermore, in the present disclosure, the composition of the base steel material is not particularly limited. For example, the base steel may include, by wt %, C: 0.10% to 1.0%, Si: 0.5% to 3%, Mn: 1.0% to 25%, Al: 0.01% to 10%, P: 0.1% or less (excluding 0%), S: 0.01% or less (excluding 0%), and the balance of Fe and inevitable impurities, and the contents of C, Si, Mn, P, and S contained in the base steel material may satisfy Condition 1 below. In addition, the base steel material having the above-described composition may include austenite or retained austenite as a microstructure.

$$[C]+[Mn]/20+[Si]/30+2[P]+4[S]\geq \geq 0.3 \qquad \text{Condition 1:}$$

(where each of [C], [Mn], [Si], [P], and [S] refers to the content (wt %) of a corresponding element)

In the case that the base steel has above-described composition and microstructure, liquid metal embrittlement (LME) may be a major problem for the following reasons. That is, austenite or retained austenite has weaker grain boundaries than other phases, and thus when stress is applied thereto during spot welding, molten zinc may penetrate into the grain boundaries of austenite or retained austenite in a weld zone to cause cracks, that is, brittle fracture by liquid metal embrittlement (LME).

However, according to the present disclosure, as described later, the time during which molten zinc remains is minimized, and thus the occurrence of liquid metal embrittlement (LME) may be effectively suppressed even if a zinc alloy plated steel material is manufactured using a steel material having the above-described composition and microstructure as a base steel material. In addition, the idea of the present disclosure may even be applied to a base steel material that does not satisfy the above-described composition.

Each of the multiple plating layers is one of a Zn plating layer, a Mg plating layer, and a Zn—Mg alloy plating layer, and the present disclosure has a technical feature in which the ratio of the weight of Mg contained in the multiple plating layers to the total weight of the multiple plating layers is from 0.13 to 0.24. More preferably, the Mg weight ratio may be within the range of 0.157 to 0.20.

Figure 2:
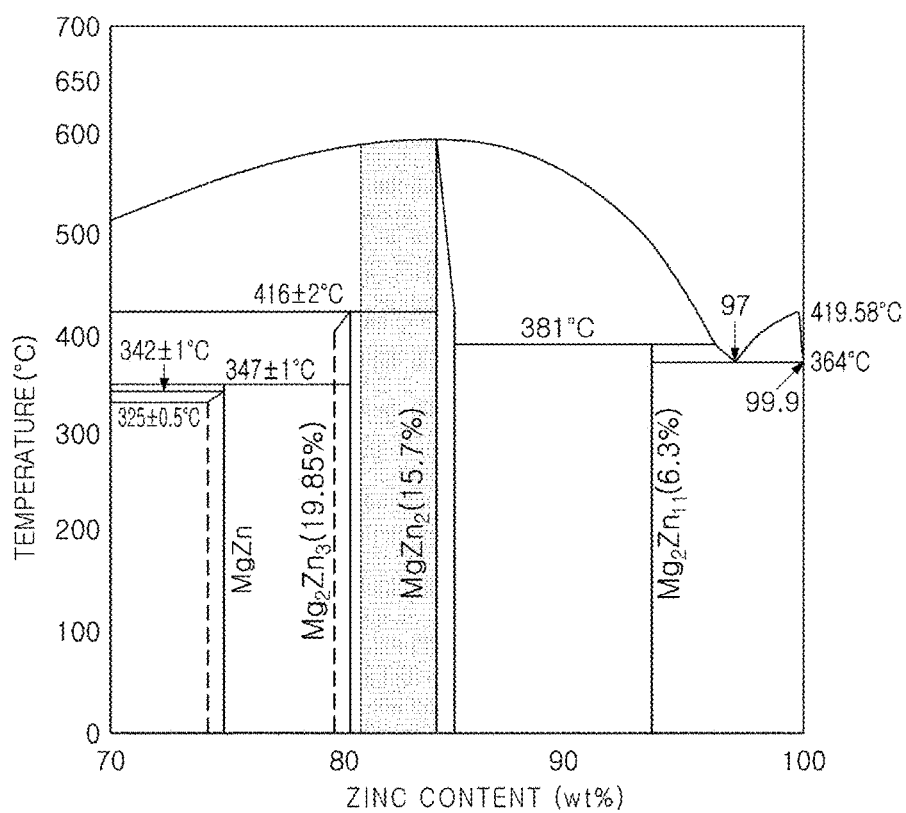
FIG. 2 is a phase diagram of a Mg—Zn binary alloy system.

The Zn—Mg alloy plating layer may have a microstructure comprising a Zn single phase, a Mg single phase, a $Mg_2Zn_{11}$ alloy phase, a $MgZn_2$ alloy phase, a MgZn alloy phase, a $Mg_7Zn_3$ alloy phase, or the like, and the present inventors have found that if the content of Mg contained in the multiple plating layers is adjusted within the above-mentioned range, the multiple plating layers are melted and changed to a single alloy layer including a $MgZn_2$ alloy phase in an area fraction of 90% or greater (including 100%) in a weld zone during spot welding, and thus liquid metal embrittlement (LME) is effectively suppressed. The reason for this may be that, as shown in the phase diagram of a Mg—Zn binary alloy system in FIG. 2, the melting point of the single alloy layer is high, and thus the time during which the single alloy layer remains in a liquid state is minimized. Furthermore, in the present disclosure, other microstructures than the $MgZn_2$ alloy phase in the single alloy layer are not particularly limited. In a non-limiting example, the single alloy layer may include a $Mg_2Zn_n$ alloy phase as a remainder in addition to the $MgZn_2$ alloy phase.

Here, phase fractions may be measured and analyzed by a standard Rietveld quantitative analysis method using an XRD and a more accurate TEM-based crystal orientation mapping technique (TEM-ASTAR) as well, but the present disclosure is not limited thereto. In addition, the phase transformation process of the Zn—Mg alloy plating layer may be analyzed using high-temperature in-situ synchrotron XRD. More specifically, the phase transformation process of the Zn—Mg alloy plating layer may be analyzed by heating specimens to 780° C. at heating rates of 1.3° C./sec and 11.3° C./sec and measuring XRD spectra at a frame rate of 1 second, totally consecutive 900 frames during a heating and cooling thermal cycle. However, this is a non-limiting example.

According to an additional study conducted by the present inventors, although the content of Mg is adjusted to be within the above-described range, it may be difficult to improve spot weldability if the content of Mg excessively deviates in the width direction of the plating layers (a direction perpendicular to the direction of rolling). Thus, it may be required to appropriately control the upper limit of the deviation of the Mg content in the width direction of the multiple plating layers, and preferably, the deviation of the Mg content may be controlled to be within ±5% when a GDS profile is measured in a thicknesswise center portion of each of the multiple plating layers.

Figure 3:
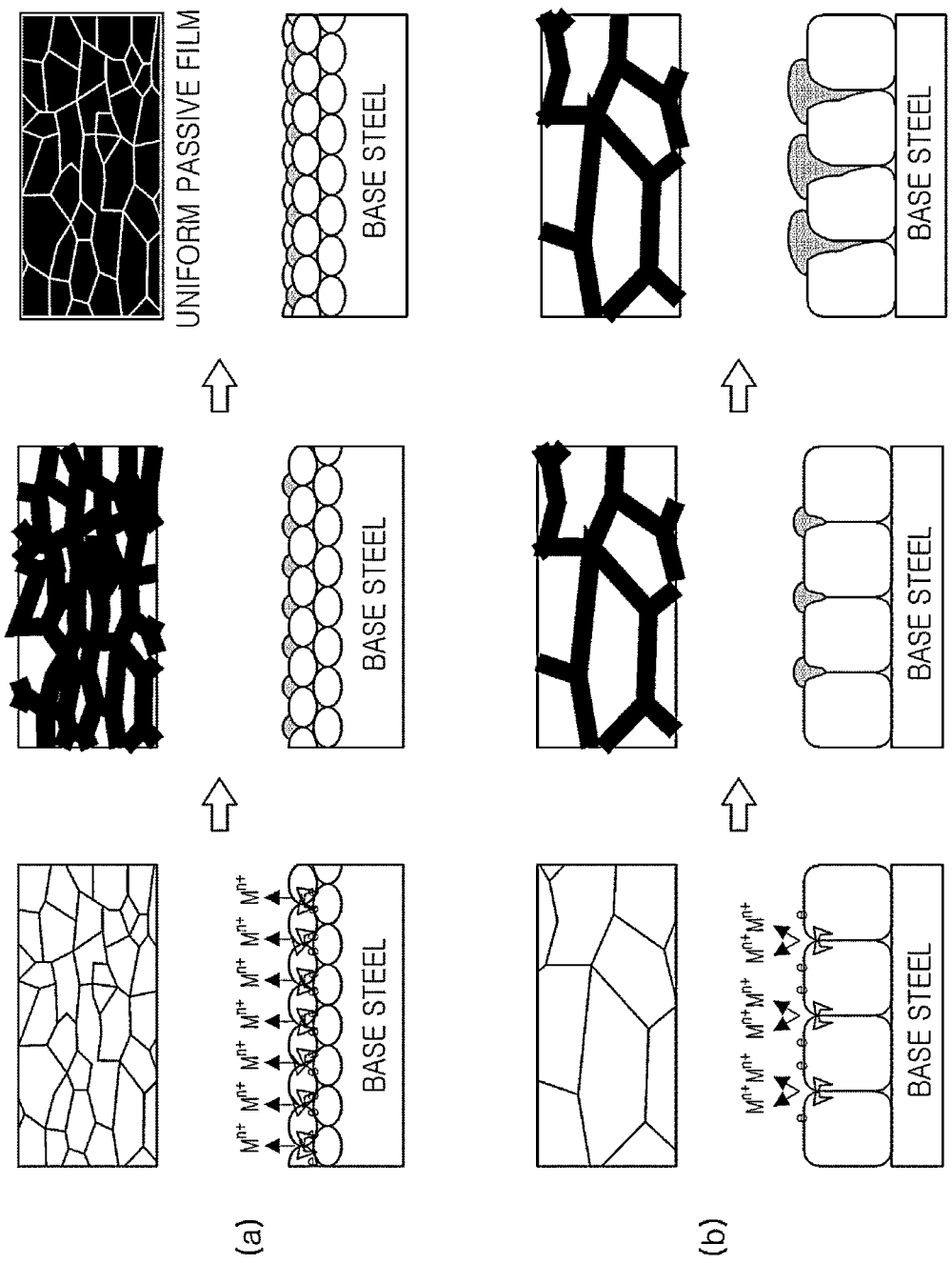
FIG. 3 is schematic views showing the corrosion processes of plated steel materials.

According to an additional study conducted by the present inventors, the average grain diameter of the multiple plating layers has a significant effect on the corrosion resistance of the plated steel material. FIGS. 3A and 3B are schematic views showing the corrosion processes of plated steel materials. FIG. 3 (*a*) is a schematic view shown the case in which grains are relatively fine, and FIG. 3 (*b*) is a schematic view illustrating the case in which grains are relatively coarse. Referring to FIGS. 3A and 3B, it could be understood that that when the size of grains is small, relatively dense and uniform corrosion products are formed while corrosion occurs, and thus corrosion may be delayed by the dense and uniform corrosion products.

In addition, the average grain diameter of the multiple plating layers also has a significant effect on the spot weldability of the plated steel material. When the average grain diameter is equal to or less than a certain value, the formation of type B cracks is remarkably reduced, and the reason for this may be that the migration of atoms in a molten plating layer actively occurs and thus the formation of an intended microstructure is facilitated.

Thus, considering the corrosion resistance and spot weldability of the plated steel, it may be required to appropriately adjust the upper limit of the average grain diameter of the multiple plating layers, and the average grain diameter of the multiple plating layers may be preferably adjusted to be 100 nm or less (excluding 0 nm). Here, the average grain diameter refers to the average long diameter of grains measured by observing thicknesswise cross-sections of the multiple plating layers.

According to an example of the present disclosure, the sum of plating amounts of the multiple plating layers may be within the range of 40 g/m² or less (excluding 0 g/m²). As the sum of plating amounts of the multiple plating layers increases, corrosion resistance may increase but liquid metal embrittlement (LME) may occur during spot welding, and thus the upper limit of the sum of plating amounts may be adjusted as described above. In addition, considering both the corrosion resistance and the spot weldability, the sum of plating amounts of the multiple plating layers may be adjusted to be preferably within the range of 10 g/m² to 35 g/m², and more preferably within the range of 15 g/m² to 30 g/m².

In addition, as described above, the zinc alloy plated steel material of the present disclosure is characterized by including two or more plating layers to improve corrosion resistance and weldability as described above, and platability and phosphate treatment properties as well. Hereinafter, this will be described in detail with specific embodiments.

Figure 4:
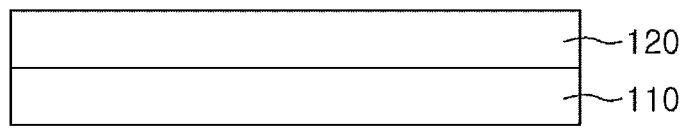
FIG. 4 is a schematic diagram illustrating a multilayer zinc alloy plated steel material 100 according to an embodiment of the present disclosure.

FIG. 4 is a schematic diagram illustrating a multilayer zinc alloy plated steel material 100 according to an embodiment of the present disclosure.

According to the embodiment of the present disclosure, multiple plating layers may include a first plating layer 110 formed on a base steel material and a second plating layer 120 formed on the first plating layer 110, wherein the first plating layer 110 may include a Zn single phase or a Zn single phase and a Zn—Mg alloy phase and may have a Mg content within the range of 7 wt % or less, and the second plating layer 120 may include a Zn—Mg alloy phase. In this case, each of the multiple plating layers may further include an additional alloy phase in addition to the Zn single phase and the Zn—Mg alloy phase.

A Zn—Mg alloy phase such as a $Mg_2Zn_n$ alloy phase, a $MgZn_2$ alloy phase, a MgZn alloy phase, or a $Mg_7Zn_3$ alloy phase is an intermetallic compound which not only has high hardness but also high brittleness, thereby lowering platability and causing separation of a plating layer when a zinc alloy plated steel material is formed. Accordingly, the present inventors have tried to impart ductility to the first plating layer 110 formed adjacent to the base steel material in order to compensate for the increase in the brittleness of the plating layers due to the formation of the Zn—Mg alloy phase, and have found, as one method for this, that when the first plating layer 110 is a Zn plating layer or a Zn—Mg alloy plating layer having a Mg content of wt % or less (prefer- ably, 6.3 wt % or less, and more preferably 5.5 wt % or less), plating adhesion may be significantly improved.

For example, the first plating layer 110 may have a composite phase including a Zn single phase and a $Mg_2Zn_n$ alloy phase, and in this case, the first plating layer 110 may include the Zn single phase in an area fraction of 20% or greater. When the first plating layer 110 has the above-described microstructure, the first plating layer 110 may have high compressive strength such that the first plating layer 110 may absorb and buffer stress during forming and may thus result in high platability.

According to an example of the present disclosure, the plating amount of the first plating layer 110 may be 3 g/m² or greater. In the present embodiment, platability may be sufficiently improved as intended by controlling the plating amount of the first plating layer 110 as described above. In an embodiment of the present disclosure, the plating amount of 3 g/m² may correspond to a thickness of 0.6 μm.

Figure 5:
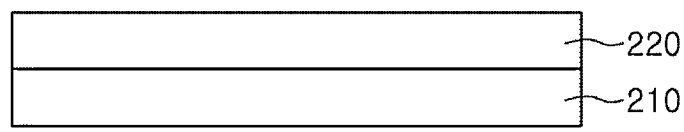
FIG. 5 is a schematic diagram illustrating a multilayer zinc alloy plated steel material 200 according to another embodiment of the present disclosure.

FIG. 5 is a schematic diagram illustrating a multilayer zinc alloy plated steel material 200 according to another embodiment of the present disclosure.

In an embodiment of the present disclosure, multiple plating layers may include a first plating layer 210 formed on a base steel material and a second plating layer 220 formed on the first plating layer 210, wherein the first plating layer 210 may include a Zn—Mg alloy phase and the second plating layer 220 may include a Zn single phase or a Zn single phase and a Zn—Mg alloy phase and may have a Mg content within the range of 2 wt % or less. In this case, each of the multiple plating layers may further include an additional alloy phase in addition to the Zn single phase and the Zn—Mg alloy phase.

If the outermost surface of the zinc alloy plated steel material 200 includes the Zn—Mg phase in a certain amount or greater, the phosphate treatment properties of the zinc alloy plated steel material may deteriorate. The reason for this is that the corrosion potential difference between the Zn—Mg alloy phase and Ni ions included in a phosphate treatment solution causes galvanic corrosion and thus promotes the dissolution of the plating layers, and as a result, pits exposing the base steel material are formed. Considering this, the second plating layer 220 located on the outermost surface of the zinc alloy plated steel material 200 may be controlled to include only the Zn single phase, or the fraction of the Zn—Mg alloy phase of the second plating layer 220 may be adjusted to be a certain value or less, so as to effectively improve the phosphate treatment properties of the zinc alloy plated steel material 200.

For example, the plating amount of the second plating layer 220 may be 2 g/m² or greater. In the present embodiment, phosphate treatment properties may be sufficiently improved as intended by controlling the plating amount of the second plating layer 220 as described above.

Figure 6:
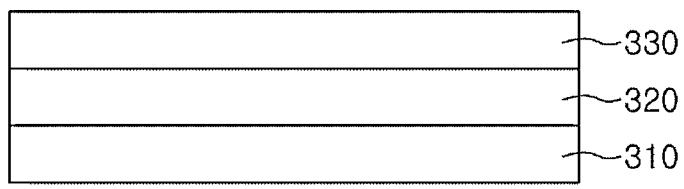
FIG. 6 is a schematic diagram illustrating a multilayer zinc alloy plated steel material 300 according to another embodiment of the present disclosure.

FIG. 6 is a schematic diagram illustrating a multilayer zinc alloy plated steel material 300 according to another embodiment of the present disclosure.

According to an embodiment of the present disclosure, multiple plating layers may include first to third plating layers 310, 320, and 330 sequentially formed on a base steel material, wherein the first plating layer 310 may include a Zn single phase or a Zn single phase and a Zn—Mg alloy phase and may have a Mg content within the range of 7 wt % or less, the second plating layer 320 may include a Zn—Mg alloy phase, and the third plating layer 330 may include a Zn single phase or a Zn single phase and a Zn—Mg alloy phase and may have a Mg content within the range of 2 wt % or less. In this case, each of the multiple plating layers may further include an additional alloy phase in addition to the Zn single phase and the Zn—Mg alloy phase.

When the zinc alloy plated steel material 300 sequentially includes the first to third plating layers 310, 320 and 330, the corrosion resistance, the spot weldability, the platability, and the phosphate treatment properties of the zinc alloy plated steel material 300.

The first plating layer 310 may have a composite phase including a Zn single phase and a $Mg_2Zn_{11}$ alloy phase, and in this case, the first plating layer 310 may include the Zn single phase in an area fraction of 20% or greater. When the first plating layer 310 has the above-described microstructure, the first plating layer 310 may have high compressive strength such that the first plating layer 110 may absorb and buffer stress during machining and may thus result in high platability.

In this case, the plating amount of the first plating layer 310 may be 3 $g/m^2$ or greater, and the plating amount of the third plating layer 330 may be 2 $g/m^2$ or greater.

Except that the multiple plating layers include the first to three layers, the zinc alloy plated steel material may have the same features as that of the multilayer zinc alloy plated steel materials of the previous embodiments which are common in this embodiment.

The zinc alloy plated steel materials of the present disclosure may be manufactured by various methods without limitations. For example, according to an embodiment, the following manufacturing method may be used.

First, a base steel material may be prepared, and a pickling process using an aqueous solution having HCl in an amount of 14 wt % or greater, a rinsing process, and a drying process may performed on the base steel material. Then, foreign substances and a natural oxide film may be removed from the surface of the base steel material by using plasma, ion beams, or the like. Next, the zinc alloy plated steel material can be obtained by forming multiple plating layers sequentially on the base steel material.

At this time, each of the multiple plating layers may be formed by an electroplating method or a general vacuum deposition method such as an electron beam method, a sputtering method, a thermal evaporation method, an induction heating evaporation method, an ion plating method. However, a Mg plating layer or a Zn—Mg alloy plating layer may be formed by an electromagnetic levitation physical vapor deposition method having an electromagnetic stirring effect.

Figure 7:
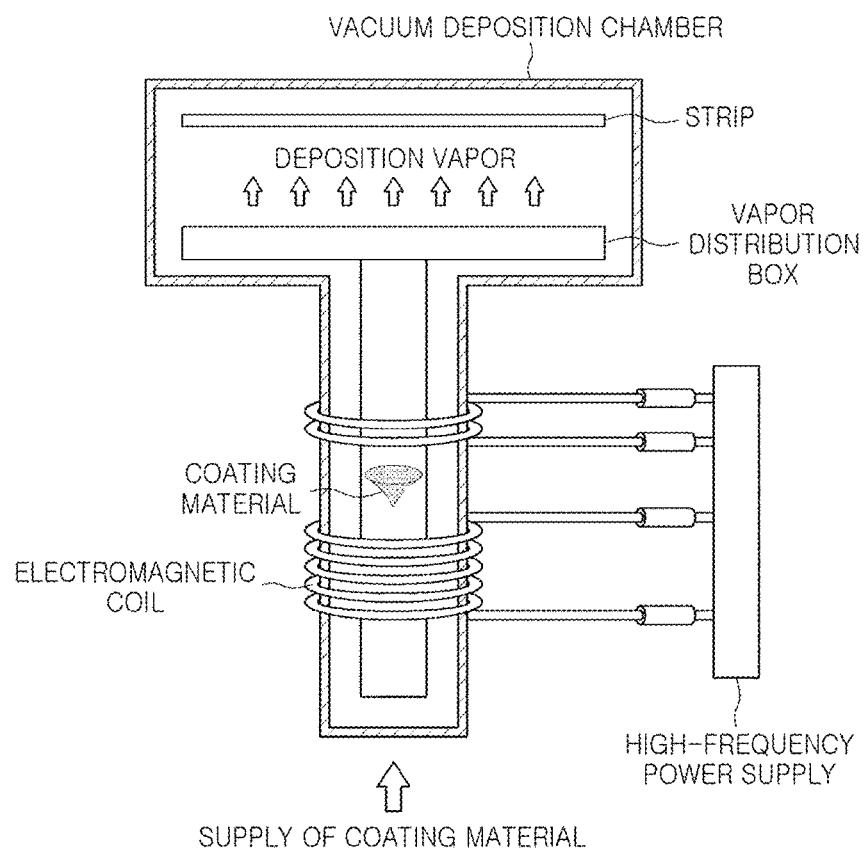
FIG. 7 is a schematic diagram illustrating an electromagnetic levitation physical vapor deposition apparatus.

Here, the term "electromagnetic levitation physical vapor deposition" refers to a method using a phenomenon in which if electromagnetic force is generated by applying high frequency power to a pair of electromagnetic coils generating an alternating electromagnetic field, a coating material (Zn, Mg or a Zn—Mg alloy in the present disclosure) is levitated in a space surround by the electromagnetic field without external help, and the levitated coating material produces a large amount of deposition vapor (metal vapor). FIG. 7 is a schematic view illustrating an apparatus for such electromagnetic levitation physical vapor deposition. Referring to FIG. 7, a large amount of deposited vapor formed by the above-described method is sprayed onto the surface of a base steel material through a plurality of nozzles of a vapor distribution box at high speed, thereby forming a plating layer.

In a general vacuum vapor deposition apparatus, a coating material is provided in a crucible, and the coating material is vaporized by heating the crucible. In this case, it is difficult to supply sufficient thermal energy to the coating material because of melting of the crucible and thermal loss at the crucible. This decreases the rate of deposition and limits grain refinement of a plating layer. In addition, there is a limit to the uniformity of a plating layer when a Zn—Mg alloy vapor is deposited as is in the present disclosure.

However, when deposition is performed by the electromagnetic levitation physical vapor deposition method, there are no temperature limitations unlike in a general vacuum deposition method, and thus the coating material may be exposed to a higher temperature environment. Therefore, deposition may be performed at a high rate, and thus a plating layer having fine grains and uniformly distributed alloying elements may be formed.

During a deposition process, the degree of vacuum inside a vacuum deposition chamber may be preferably adjusted to be within the range of $1.0 \times 10^{-3}$ mbar to $1.0 \times 10^{-5}$ mbar, and in this case, an increase in brittleness and deterioration of material properties may be effectively prevented when a plating layer is formed.

In the deposition process, preferably, the temperature of the levitated coating material may be adjusted to be 700° C. or greater, more preferably 800° C. or greater, and even more preferably 1000° C. or greater. If the temperature of the levitated coating material is less than 700° C., grain refinement and plating layer uniformity may not be sufficiently guaranteed. In addition, as the temperature of the levitated coating material increases, intended technical effects may be easily obtained, and thus the upper limit of the temperature of the levitated coating material is not limited to a particular value in the present disclosure. However, if the temperature is higher than a certain value, such effects are saturated, and processing costs increase excessively. Thus, the upper limit of the temperature may be set to be 1500° C.

Preferably, the temperature of the base steel material may be adjusted to be 100° C. or less before and after the deposition process. If the temperature of the base steel material exceeds 100° C., the temperature of the base steel material may not be uniform in the width direction thereof, and thus the base steel material may have a radius curve in the width direction thereof, making it difficult to maintain the degree of vacuum when the base steel material passes through a multistage differential pressure reducing system at an exit side.

MODE FOR INVENTION

Hereinafter, the present disclosure will be described more specifically through examples. However, the following examples are for illustrative purposes only and are not intended to limit the scope of the present disclosure. The scope of the present invention is defined by the appended claims, and modifications and variations reasonably made therefrom.

EXAMPLES

High-strength cold rolled steel sheets for automobiles, having a thickness of 1.4 mm and including, by wt %, C: 0.16%, Si: 1.43%, Mn: 2.56%, Al: 0.04%, P: 0.006%, S: 0.0029%, and the balance of Fe and inevitable impurities, were prepared, and multilayer zinc alloy plated steel materials including multiple plating layers having compositions as shown in Table 1 below were fabricated from the prepared high-strength cold rolled steel sheets by using the apparatus shown in FIG. 7 (vacuum degree: $3.2 \times 10^{-3}$ mbar). In each example, each plating layer was formed through a separate process using a separate vacuum chamber, and when each plating layer was formed, a current of 1.2 kA was applied to a pair of electromagnetic coils, a frequency applied to the pair of electromagnetic coils was adjusted to be 60 kHz based on 2 kg of a deposition material, the temperature of a levitated coating material was set to 1000° C., and the temperature of the vapor distribution box was constantly maintained at 900° C. In addition, the temperature of the base steel was constantly maintained at 60° C. before and after each plating layer was deposited.

Next, the plating amount and the Mg weight ratio of each multilayer zinc alloy plated steel material were measured using an inductively coupled plasma (ICP) method. More specifically, a specimen having a size of 80 mm×80 mm was cut out, the surface of the specimen was degreased, and then, the weight of the specimen was primarily measured using a high-precision scale (primary weight $W_1$: 0.0000 g). Thereafter, the front side of the specimen was attached to a column for an 54.5 mm diameter O-ring by using a clamp and was tightened to prevent leakage of a solution. Then, 30 cc of a 1:3 HCl solution was added, and two or three drops of an inhibitor were added. After the generation of $H_2$ gas on a surface, the solution was collected in a 100-cc mass flask. At that time, all the remaining solution was collected using a cleaning bottle in an amount of 100 cc or less. Thereafter, the specimen was completely dried, the weight of the specimen was measured (secondary weight $W_2$), and the value obtained by dividing the difference between the primary weight $W_1$ and the secondary weight $W_2$ by a unit area was taken as a total plating amount. In addition, the content of Mg was measured using the collected solution by an ICP method as a Mg weight ratio.

Next, a GDS profile was measured at a thicknesswise center portion of each of the multiple plating layers, and the average grain diameter of the multiple plating layers was measured. Results of measurement showed that the content of Mg deviated within the range of ±5% and the average particle diameter was 100 μm or less in all the examples.

Next, the weldability, corrosion resistance, powdering resistance, and phosphate treatment properties of each multilayer zinc alloy plated steel material were evaluated, and Table 2 below shows results thereof.

More specifically, according to SEP 1220-2, specimens having a size of 40 mm×120 mm were prepared by cutting, and the formation of type B cracks and the size of type B cracks were measured after performing a spot welding process on each specimen 100 times. Then, weldability was evaluated according to the following criteria.

1. Very good: no type B cracks were formed in all specimens.
2. Good: type B cracks were formed in some or all specimens, and the average length of the type B cracks was equal to or less than 0.1 times the thickness of the base steel material (cold rolled steel sheet).
3. Normal: type B cracks were formed in some or all specimens, and the average length of the type B cracks was greater than 0.1 times the thickness of the base steel material (cold rolled steel sheet) but equal to or less than 0.2 times the thickness of the base steel material.
4. Poor: type B cracks were formed in some or all specimens, and the average length of the type B cracks was greater than 0.2 times the thickness of the base steel material (cold rolled steel sheet).

Corrosion resistance was evaluated by cutting specimens having a size of 75 mm×150 mm out of the multilayer zinc alloy plated steel materials, performing a salt spray test on the specimens by JIS 22371 to measure times of the occurrence of initial red rust, and performing evaluation according to the following criteria.

1. Good: the time period until the occurrence of red rust was equal to or greater than twice the red rust occurrence time period of a zinc plated steel sheet (GI steel sheet) having a plating amount of 60 $g/m^2$ on one side.
2. Normal: the time period until the occurrence of red rust was similar to the red rust occurrence time period of a zinc plated steel sheet (GI steel sheet) having the plating amount of 60 $g/m^2$ on one side, or less than twice the red rust occurrence time period of the zinc plated steel sheet (GI steel sheet).
3. Poor: the time period until the occurrence of red rust was less than the red rust occurrence time period of the zinc plated steel sheet (GI steel sheet) having a plating amount of 60 $g/m^2$ on one side.

Powdering resistance was evaluated by cutting specimens having a size of 40 mm×80 mm out of the multilayer zinc alloy plated steel materials, setting the specimens to a press tester, performing a 60° bending test on the specimens, detaching the specimens from the tester, attaching cellophane tape to bent portions of the specimens, separating the cellophane tape, attaching the separated cellophane tape to white paper to measure peeled-off widths, and performing evaluation according to the following criteria.

1. Good: peeled-off width was 6.0 mm or less.
2. Normal: peeled-off width was greater than 6.0 mm but equal to or less than 8.0 mm.
3. Poor: peeled-off width was greater than 8.0 mm.

Phosphate treatment properties were evaluated by cutting specimens having a size of 75 mm×150 mm out of the multilayer zinc alloy plated steel materials, performing surface adjustment and phosphate treatment according to general specifications of automobile company, and evaluating the uniformity of phosphate.

1. Good: phosphate film was uniformly formed.
2. Poor: phosphate film was not uniformly formed.

TABLE 1

| No. | First plating layer | | Second plating layer | | Third plating layer | | Mg weight ratio | Note |
|---|---|---|---|---|---|---|---|---|
| | Type (wt %) | Plating amount ($g/m^2$) | Type (wt %) | Plating amount ($g/m^2$) | Type (wt %) | Plating amount ($g/m^2$) | | |
| 1 | Zn | 5 | Zn—Mg(16.5% Mg) | 15 | — | — | 0.124 | *CE1 |
| 2 | Zn | 5 | Zn—Mg(17.0% Mg) | 15 | — | — | 0.128 | CE2 |
| 3 | Zn | 5 | Zn—Mg(17.3% Mg) | 15 | — | — | 0.130 | **IE1 |
| 4 | Zn | 5 | Zn—Mg(18.7% Mg) | 15 | — | — | 0.140 | IE2 |
| 5 | Zn | 5 | Zn—Mg(20.7% Mg) | 15 | — | — | 0.155 | IE3 |
| 6 | Zn | 5 | Zn—Mg(21.0% Mg) | 15 | — | — | 0.158 | IE4 |
| 7 | Zn | 5 | Zn—Mg(22.0% Mg) | 15 | — | — | 0.165 | IE5 |

TABLE 1-continued

| | First plating layer | | Second plating layer | | Third plating layer | | | |
|---|---|---|---|---|---|---|---|---|
| No. | Type (wt %) | Plating amount (g/m²) | Type (wt %) | Plating amount (g/m²) | Type (wt %) | Plating amount (g/m²) | Mg weight ratio | Note |
| 8 | Zn | 5 | Zn—Mg(24.0% Mg) | 15 | — | — | 0.180 | IE6 |
| 9 | Zn | 5 | Zn—Mg(26.0% Mg) | 15 | — | — | 0.195 | IE7 |
| 10 | Zn | 5 | Zn—Mg(27.3% Mg) | 15 | — | — | 0.205 | IE8 |
| 11 | Zn | 5 | Zn—Mg(29.3% Mg) | 15 | — | — | 0.220 | IE9 |
| 12 | Zn | 5 | Zn—Mg(32.0% Mg) | 15 | — | — | 0.240 | IE10 |
| 13 | Zn | 5 | Zn—Mg(32.3% Mg) | 15 | — | — | 0.242 | CE3 |
| 14 | Zn | 5 | Zn—Mg(32.6% Mg) | 15 | — | — | 0.245 | CE4 |
| 15 | Zn—Mg(5.0% Mg) | 5 | Zn—Mg(22.3% Mg) | 15 | — | — | 0.180 | IE11 |
| 16 | Zn—Mg(8.0% Mg) | 5 | Zn—Mg(21.3% Mg) | 15 | — | — | 0.180 | IE12 |
| 17 | Zn—Mg(15.0% Mg) | 17 | Zn | 3 | — | — | 0.128 | CE5 |
| 18 | Zn—Mg(17.0% Mg) | 17 | Zn | 3 | — | — | 0.145 | IE13 |
| 19 | Zn—Mg(21.2% Mg) | 17 | Zn | 3 | — | — | 0.180 | IE14 |
| 20 | Zn—Mg(25.9% Mg) | 17 | Zn | 3 | — | — | 0.220 | IE15 |
| 21 | Zn—Mg(28.5% Mg) | 17 | Zn | 3 | — | — | 0.242 | CE6 |
| 22 | Zn | 5 | Zn—Mg(20.8% Mg) | 12 | Zn | 3 | 0.125 | CE7 |
| 23 | Zn | 5 | Zn—Mg(27.5% Mg) | 12 | Zn | 3 | 0.165 | IE16 |
| 24 | Zn | 10 | Zn—Mg(27.5% Mg) | 24 | Zn | 6 | 0.165 | IE17 |
| 25 | Zn | 5 | Zn—Mg (30% Mg) | 12 | Zn | 3 | 0.180 | IE18 |
| 26 | Zn | 10 | Zn—Mg (30% Mg) | 24 | Zn | 6 | 0.180 | IE19 |
| 27 | Zn | 5 | Zn—Mg(36.6% Mg) | 12 | Zn | 3 | 0.220 | IE20 |
| 28 | Zn | 5 | Zn—Mg(40.8% Mg) | 12 | Zn | 3 | 0.245 | CE8 |

*CE: Comparative Example,
**IE: Inventive Example

TABLE 2

| No. | Weldability | Corrosion resistance | Powdering resistance | Phosphate treatment properties | Note |
|---|---|---|---|---|---|
| 1 | 4 | 1 | 1 | 2 | *CE1 |
| 2 | 3 | 1 | 1 | 2 | CE2 |
| 3 | 2 | 1 | 1 | 2 | **IE1 |
| 4 | 2 | 1 | 1 | 2 | IE2 |
| 5 | 2 | 1 | 1 | 2 | IE3 |
| 6 | 1 | 1 | 1 | 2 | IE4 |
| 7 | 1 | 1 | 1 | 2 | IE5 |
| 8 | 1 | 1 | 1 | 2 | IE6 |
| 9 | 1 | 1 | 1 | 2 | IE7 |
| 10 | 2 | 1 | 1 | 2 | IE8 |
| 11 | 2 | 1 | 1 | 2 | IE9 |
| 12 | 2 | 1 | 1 | 2 | IE10 |
| 13 | 3 | 1 | 1 | 2 | CE3 |
| 14 | 3 | 1 | 1 | 2 | CE4 |
| 15 | 1 | 1 | 1 | 2 | IE11 |
| 16 | 1 | 1 | 2 | 2 | IE12 |
| 17 | 3 | 1 | 3 | 1 | CE5 |
| 18 | 2 | 1 | 3 | 1 | IE13 |
| 19 | 1 | 1 | 3 | 1 | IE14 |
| 20 | 2 | 1 | 3 | 1 | IE15 |
| 21 | 3 | 1 | 3 | 1 | CE6 |
| 22 | 3 | 1 | 1 | 1 | CE7 |
| 23 | 1 | 1 | 1 | 1 | IE16 |
| 24 | 2 | 1 | 1 | 1 | IE17 |
| 25 | 1 | 1 | 1 | 1 | IE18 |
| 26 | 2 | 1 | 1 | 1 | IE19 |
| 27 | 2 | 1 | 1 | 1 | IE20 |
| 28 | 3 | 1 | 1 | 1 | CE8 |

*CE: Comparative Example,
**IE: Inventive Example

Referring to Table 2, Inventive Examples 1 to 20 satisfying all the conditions proposed in the present disclosure had high corrosion resistance and spot weldability. In addition, it could be found that it is preferable that the Mg weight ratio is within the range of 0.157 to 0.20 and the sum of plating amounts of the multiple plating layers be within the range of 35 g/m2 or less, so as to further improve spot weldability.

However, since Comparative Examples 1 to 8 had a Mg weight ratio outside the range proposed in the present disclosure, the spot weldability of Comparative Samples 1 to 8 was poor.

In addition, referring to Table 2, it could be found that that when the lowest plating layer is a Zn plating layer or a Zn—Mg alloy plating layer having a Mg content preferably within the range of 7 wt % or less (excluding 0 wt %), platability can be improved, and when the uppermost plating layer is a Zn plating layer or a Zn—Mg alloy plating layer having a Mg content preferably within the range of 2 wt % or less (excluding 0 wt %), phosphate treatment properties can be improved.

Figure 8:
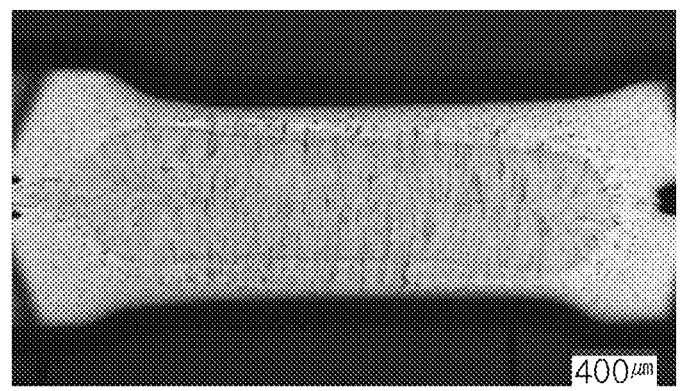
FIG. 8 is an image showing a weld zone formed by a spot welding in a multilayer zinc alloy plated steel material of Inventive Sample 18.

FIG. 8 is an image showing a weld zone formed by a spot welding in a multilayer zinc alloy plated steel material of Inventive Sample 18. Referring to FIG. 8, it could be visually checked that the multiple plating layers of the multilayer zinc alloy plated steel material of the present disclosure was changed to a single alloy layer after welding, the single alloy layer in the weld zone had a $MgZn_2$ alloy phase in an area fraction of 90% or greater, and type B cracks and type C were not formed in the weld zone.

DESCRIPTIONS OF REFERENCE NUMERALS

100, 200, 300: MULTILAYER ZINC ALLOY PLATED STEEL MATERIALS
110, 210, 310: FIRST PLATING LAYERS
120, 220, 320: SECOND PLATING LAYERS
330: THIRD PLATING LAYER

The invention claimed is:
1. A multilayer zinc alloy plated steel material comprising:
   a base steel material having a thickness; and
   multiple plating layers formed on the base steel material,
   wherein a ratio of a weight of Mg contained in the multiple plating layers to a total weight of the multiple plating layers is from 0.13 to 0.24, wherein the multiple plating layers comprise a first plating layer formed on the base steel material and a second plating layer formed on the first plating layer, the first plating layer comprises a Zn—Mg alloy phase, and the second plating layer comprises a Zn single phase or a Zn single phase and a Zn—Mg alloy phase and has a Mg content within a range of 2 wt % or less.

2. The multilayer zinc alloy plated steel material of claim 1, wherein, when a GDS profile is measured at a thickness-wise center portion of each of the multiple plating layers, a Mg content in the each of the multiple plating layers deviates within a range of ±5% in a width direction of the each of the multiple plating layers which is a direction perpendicular to a rolling direction of the base steel material.

3. The multilayer zinc alloy plated steel material of claim 1, wherein grains of the multiple plating layers have an average diameter of 100 nm or less (excluding 0 nm).

4. The multilayer zinc alloy plated steel material of claim 1, wherein a total plating amount of the multiple plating layers is 40 g/m² or less (excluding 0 g/m²).

5. The multilayer zinc alloy plated steel material of claim 1, wherein, when spot welding is performed on the multilayer zinc alloy plated steel material, the multiple plating layers are configured to be changed to a single alloy layer in a weld zone, and the single alloy layer comprises: a $MgZn_2$ alloy phase in an area fraction of 90% or greater (including 100%).

6. The multilayer zinc alloy plated steel material of claim 1, wherein, when spot welding is performed in accordance with SEP 1220-2, an average length of type B cracks is equal to or less than 0.1 times the thickness of the base steel material.

7. The multilayer zinc alloy plated steel material of claim 1, wherein the base steel material comprises, by wt %, C: 0.10% to 1.0%, Si: 0.5% to 3%, Mn: 1.0% to 25%, Al: 0.01% to 10%, P: 0.1% or less (excluding 0%), S: 0.01% or less (excluding 0%), and a balance of Fe and inevitable impurities, and wherein the contents of C, Si, Mn, P, and S satisfy Condition 1 below:

$$[C]+[Mn]/20+[Si]/30+2[P]+4[S]\geq 0.3 \qquad \text{Condition 1:}$$

where each of [C], [Mn], [Si], [P], and [S] refers to a content (wt %) of a corresponding element.

8. The multilayer zinc alloy plated steel material of claim 1, wherein a sum of plating amounts of the first and second plating layers is within a range of 40 g/m² or less (excluding 0 g/m²), and a plating amount of the second plating layer is within a range of 2 g/m² or greater.

9. The multilayer zinc alloy plated steel material of claim 1, wherein the ratio is from 0.157 to 0.20.

10. The multilayer zinc alloy plated steel material of claim 1, wherein a total plating amount of the multiple plating layers is within a range of 10 g/m² to 35 g/m².

* * * * *